United States Patent
Tsao et al.

(10) Patent No.: US 6,638,837 B1
(45) Date of Patent: Oct. 28, 2003

(54) METHOD FOR PROTECTING THE FRONT SIDE OF SEMICONDUCTOR WAFERS

(75) Inventors: Pei-Haw Tsao, Taichung (TW); Chender Huang, Hsin-chu (TW); Jones Wang, Jung he (TW); Ken Chen, Hsinchu (TW); Hank Huang, Jungli (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/251,441

(22) Filed: Sep. 20, 2002

(51) Int. Cl.⁷ .................... H01L 21/30; H01L 21/46
(52) U.S. Cl. .................... 438/459; 438/613
(58) Field of Search .................... 438/612, 613, 438/118, 459

(56) References Cited

U.S. PATENT DOCUMENTS

| | | | |
|---|---|---|---|
| 5,331,772 A | | 7/1994 | Steere, III et al. ............ 51/268 |
| 5,632,667 A | | 5/1997 | Earl et al. ............ 451/41 |
| 5,731,229 A | * | 3/1998 | Kato et al. ............ 438/50 |
| 5,808,329 A | * | 9/1998 | Jack et al. ............ 257/188 |
| 5,808,350 A | * | 9/1998 | Jack et al. ............ 257/440 |
| 5,888,838 A | | 3/1999 | Mendelson et al. ............ 438/15 |
| 5,981,391 A | * | 11/1999 | Yamada ............ 438/690 |
| 6,060,373 A | * | 5/2000 | Saitoh ............ 438/459 |
| 6,071,184 A | | 6/2000 | Anderson, III ............ 451/398 |
| 6,159,767 A | * | 12/2000 | Eichelberger ............ 438/107 |
| 6,255,640 B1 | * | 7/2001 | Endo et al. ............ 250/208.1 |

* cited by examiner

Primary Examiner—John F. Niebling
Assistant Examiner—Angel Roman
(74) Attorney, Agent, or Firm—George O. Saile; Stephen B. Ackerman; Douglas R. Schnabel

(57) ABSTRACT

A method of protecting the active surface, front side, of semiconductor wafers during the operations of backside grinding, transporting, and packaging has been achieved. The invention discloses a method for applying an organic passivation layer or an aqueous material for protection of the active components. These materials are easily removed prior to final packaging of the dies.

14 Claims, 3 Drawing Sheets

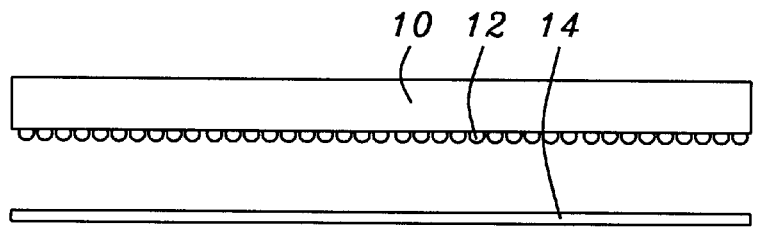
*FIG. 1a - Prior Art*
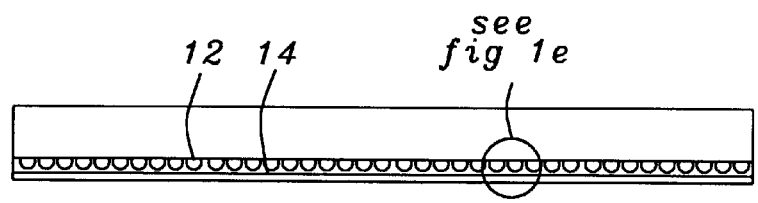
*FIG. 1b - Prior Art*
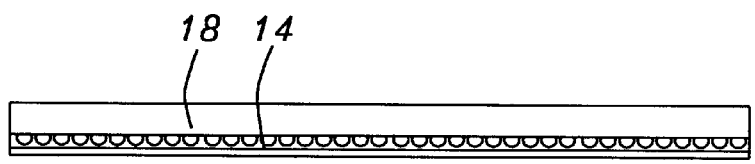
*FIG. 1c - Prior Art*
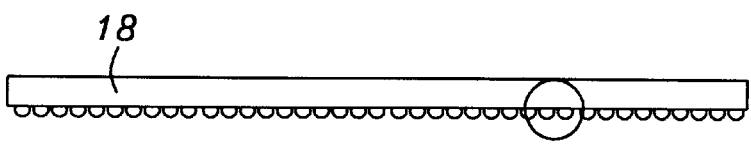
*FIG. 1d - Prior Art*

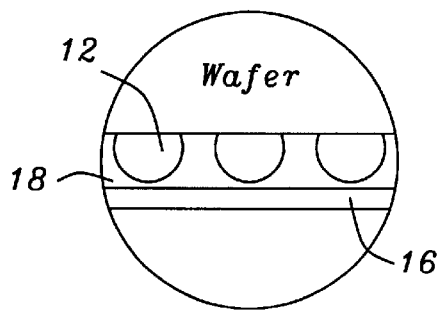
*FIG. 1e — Prior Art*
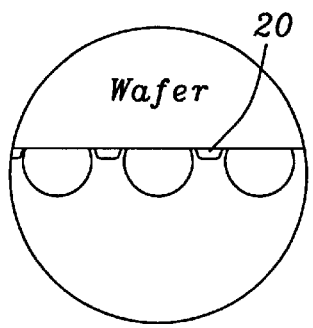
*FIG. 1f — Prior Art*
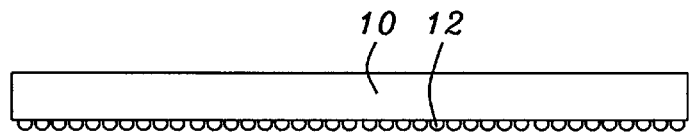
*FIG. 2a*
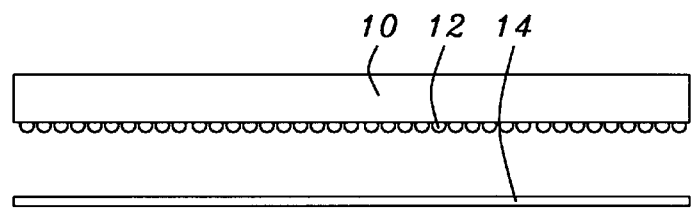
*FIG. 2b*

METHOD FOR PROTECTING THE FRONT SIDE OF SEMICONDUCTOR WAFERS

BACKGROUND OF INVENTION

1. Technical Field

This invention relates in general to the protection of the front side surface of semiconductor wafers during the processes of backside grinding, transporting, and packaging.

2. Description of Prior Art

The following four U. S. patents relate to the protection of wafers and to the process of backside wafer grinding.

U.S. Pat. No. 5,632,667 issued May 27, 1997, to Michael R. Earl et. al. discloses a no coat backside wafer grinding process.

U.S. Pat. No. 5,888,838 issued Mar. 30, 1999, to Ronald Lee Mendelson et. al. discloses a process for preventing breakage during wafer backside grinding.

U.S. Pat. No. 6,071,184 issued Jun. 6, 2000, to David T. Anderson III discloses a process and apparatus for wafer backside grinding.

U.S. Pat. No. 5,331,772 issued Jul. 26, 1994, to Robert E. Steere III discloses a seal assembly used during wafer backside grinding.

The use of semiconductor devices in electronic products specifically portable ones such as laptop computers, digital cameras, cam-corders, as well as products for military use require highly dense circuitry. Volumetric density of circuits at the package level has become an important parameter. This demand has resulted in the requirement for thinner semiconductor chips. In order to meet this requirement, the semiconductor industry has incorporated wafer grinding to obtain the thinner chips or dies required.

In general, a semiconductor wafer is sliced from a crystal ingot at a thickness determined by the size of the wafer and the stresses the wafer will be subjected to during further processing. Semiconductor processes also require that the wafer remain relatively flat during processing so as to obtain acceptable product yields. To this end wafer thickness is chosen larger than required by the devices that are fabricated on them.

In order to obtain the volumetric densities required by the products, the wafers are thinned. This is accomplished by grinding material off the backside of the wafers after the necessary circuit patterns have been fabricated on the front side of the wafers. The grinding process, by its nature, results in contaminants such as silicon and/or grinding wheel residues being present and adhering to the active front side of the wafer. These unwanted contaminants result in yield loss of the wafers. To prevent the contamination the front of the wafers are covered by various means during the grinding process.

One of these methods is to utilize a dry film adhesive tape on the front side of the wafer of a thickness so as to cover any protrusions; i.e., solder bumps. This tape protects and also provides a planar surface for the grinding operation. An important drawback inherent to this process is the residue that results on the surface of the wafer after the adhesive dry film is removed.

The current process of wafer front side protection during grinding is shown in FIG. 1 and is the prior art. The wafer, item 10 FIGS. 1a–1f, prior to grinding is shown with solder bumps 12 on the front side of the wafer. The dry film adhesive tape 14 is attached to the front side of the wafer as shown in 1b. The dry film is composed of a base film layer 16 and an adhesive tape layer 18 for adhesion to the wafer during the grinding operation. The wafer 18 is then ground to the desired thickness as shown in FIG. 1c. The adhesive tape 14 is then removed usually by a mechanical process; i.e., peeling. The resultant thin wafer 18 can possess the unwanted residual particles 20 from the adhesive.

SUMMARY OF THE INVENTION

The primary objective of the present invention is to provide a method for fabricating a protective structure to be used in the manufacture of semiconductor wafers. The purpose of this structure is to protect the active front side of the semiconductor wafers during the process of wafer grinding, transporting, and packaging.

Another objective of the present invention is to provide an easily removable protective structure.

An additional objective of the present invention is that the protective film have minimum residue upon removal.

It is also the objective of the present invention that the film fabrication process is compatible with the present fabrication methods.

The above objectives are achieved by the present invention as it provides a film structure and method for fabricating a protective layer of benzotriazole or benzimidazole as an organic passivation layer on the active front side of a semiconductor wafer. This organic passivation layer is applied to the active front side of the wafer prior to the application of an adhesive tape layer that is required for planarization and for securing the wafer during the wafer backside grinding process.

During the wafer backside grinding process the organic passivation layer and the adhesive tape layer protect the active front side of the wafer from silicon and grinding wheel particles. In addition, any protrusions on the front side of the wafer such as solder bumps are protected from oxidation.

After the wafer backside grinding is completed, the protective layers of the organic passivation and the adhesive tape are removed by subjecting the wafer to a heat treatment process at a temperature of 150° C.–240° C. At this temperature the organic passivation layer is vaporized and the adhesive layer can be easily removed.

An additional protective process is also described. This process utilizes an aqueous or organic material to protect the front side of semiconductor wafers that have microlens CMOS image sensors. This material is used to protect these devices during transport and packaging processes.

DESCRIPTION OF THE DRAWINGS

FIGS. 1a–1f show the present wafer grinding process of the prior art.

FIGS. 2a–2g show the wafer grinding process of the present invention.

DETAILED DESCRIPTION OF THE PREFERRED EMBODIMENT

The demands on the semiconductor industry for high volumetric densities, circuits or bits per cubic cm have resulted in the incorporation of the process of grinding away material from the backside of semiconductor wafers as a final step prior to dicing into individual chips or dies.

It is crucial that the process steps involved in the backside grinding operation have a high yield as the wafers have been through the many processes that fabricate the semiconductor circuits.

Figure 2C:
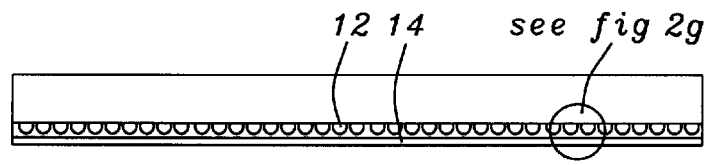
Figure 2D:
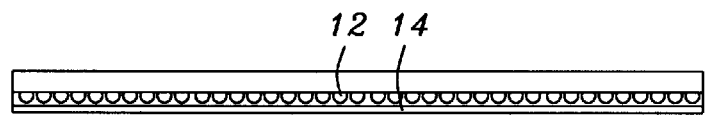
Figure 2E:
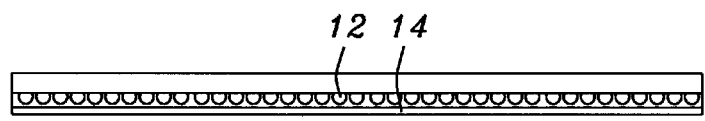
Figure 2F:
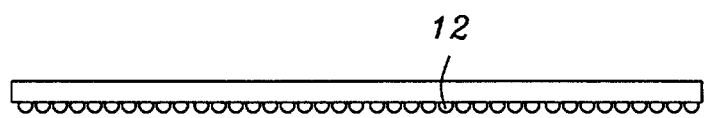
Figure 2G:
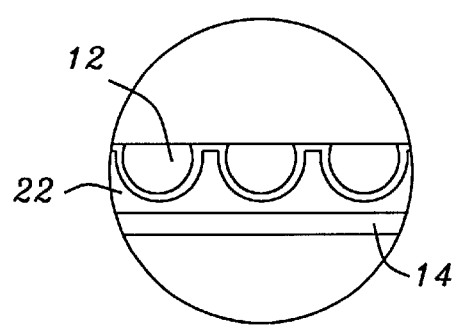

To accomplish these requirements the present invention utilizes an organic passivation layer and an adhesive tape layer during the wafer backside grinding process as shown in FIGS. 2a–2g.

The front side of the solder bumped wafer 10 is coated with the organic passivation layer 22 benzotriazole or benzimidazole.

The adhesive tape layer 14 is then attached to the front side of the wafer.

The backside of the wafer is then processed through the grinding operation.

The wafer is then subjected to a heat treatment of 150° C.–240° C. to vaporize the organic passivation layer.

The adhesive tape layer is removed.

The vaporization of the organic passivation layer allows for the detachment of the adhesive tape without leaving any residual contaminants. This is due to the fact that the adhesive tape had adhered to the organic passivation layer and not the wafer surface or any protrusions such as solder bumps.

Another embodiment of this invention describes a method to protect the front side of semiconductor wafers utilizing an aqueous or organic material. This material is applied to the front side of a semiconductor wafer after the final active element process. The semiconductor wafer is then processed through dicing, and placed in a package. The aqueous or organic material is then removed. Final processing, i.e., packaging ceiling is then completed. This embodiment is used with semiconductor wafers that include CMOS image sensors utilizing microlenses on the front surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed:

1. A method for protecting a front side of a semiconductor wafer that includes solder bumps, comprising:

depositing an organic passivation layer comprising benzotriazole over a semiconductor substrate;

applying a layer of adhesive tape over said organic passivation layer;

thining the semiconductor substrate by backside grinding;

vaporizing the organic passivation layer; and thereafter removing the adhesive tape.

2. The method of claim 1 wherein the organic passivation layer is between about 1 and 12 um in thickness.

3. The method of claim 1 wherein the organic passivation layer is deposited by spray coating.

4. The method of claim 1 wherein the organic passivation layer is deposited by spin coating.

5. The method of claim 1 wherein the organic passivation layer is deposited by curtain coating.

6. The method of claim 1 wherein the passivation layer is vaporized by subjecting the wafer to a 150° C.–240° C. bake.

7. A method that utilizes an aqueous compound to protect a microlens of a CMOS image sensor on an integrated circuit wafer, said method comprising:

coating an active surface of a finished said integrated circuit wafer with an aqueous compound comprising benzotriazole to form an organic passivation layer;

thereafter processing the integrated circuit wafer;

thereafter removing the organic passivation layer; and thereafter sealing said CMOS image sensor in a package.

8. The method of claim 7 wherein organic passivation layer is removed by a water rinse.

9. The method of claim 7 wherein the organic passivation layer has a thickness of between about 1 and 10 um.

10. A method for protecting a front side of a semiconductor wafer that includes solder bumps, comprising:

depositing an organic passivation layer comprising benzimidazole over a semiconductor substrate;

applying a layer of adhesive tape over said organic passivation layer;

thining the semiconductor substrate by backside grinding;

vaporizing the organic passivation layer; and thereafter removing the adhesive tape.

11. The method of claim 10 wherein the organic passivation layer is between about 1 and 12 um in thickness.

12. The method of claim 10 wherein the organic passivation layer is deposited by spray coating.

13. The method of claim 10 wherein the organic passivation layer is deposited by spin coating.

14. The method of claim 10 wherein the organic passivation layer is deposited by curtain coating.

* * * * *